United States Patent [19]

Kozlov et al.

[11] Patent Number: 5,605,048
[45] Date of Patent: Feb. 25, 1997

[54] METHOD OF COOLING AN OBJECT WITH A THERMOELECTRIC BATTERY CASCADE

[75] Inventors: Jury F. Kozlov; Valery M. Berdnikov, both of Moscow, U.S.S.R.

[73] Assignee: Tovarischestvo s ogranichennoi otvetstvennostju Libratsia, Moscow, Russian Federation

[21] Appl. No.: 433,338
[22] PCT Filed: Sep. 3, 1993
[86] PCT No.: PCT/RU93/00224
§ 371 Date: Jun. 9, 1995
§ 102(e) Date: Jun. 9, 1995
[87] PCT Pub. No.: WO94/10514
PCT Pub. Date: Mar. 11, 1994

[30] Foreign Application Priority Data

Nov. 5, 1992 [SU] U.S.S.R. ................ 92004830

[51] Int. Cl.⁶ ............................................. F25B 21/02
[52] U.S. Cl. ............................ 62/3.7; 62/335; 62/175
[58] Field of Search ........................ 62/3.2, 3.7, 335, 62/157, 175

[56] References Cited

U.S. PATENT DOCUMENTS

| 3,100,969 | 8/1963 | Elfuing | 62/335 |
| 3,650,117 | 3/1972 | Robinson et al. | 62/3.1 |
| 4,833,889 | 5/1989 | Harwell et al. | 62/3.2 |

FOREIGN PATENT DOCUMENTS

| 0275829 | 7/1988 | European Pat. Off. . |
| 2468086 | 10/1979 | France . |
| 322821 | 11/1971 | U.S.S.R. . |
| 641248 | 4/1977 | U.S.S.R. . |
| 89/01594 | 8/1988 | WIPO . |

OTHER PUBLICATIONS

E. A. Kolenko, "Thermoelectric Refrigerating Devices" R & D Institute for Semiconductors of the U.S.S.R. Academy of Science (in Russian with English Translation) pp. 7–11.

Primary Examiner—Henry A. Bennett
Assistant Examiner—William C. Doerrler
Attorney, Agent, or Firm—Ladas & Parry

[57] ABSTRACT

A method of cooling an object with a thermoelectric battery cascade which is based on carrying heat from the object and further from stage to stage with an adjustable regulated direct current applied to the terminals of the battery until a steady-state operation mode is obtained corresponding to the required temperature of the object being cooled. In accordance with the invention transfer of heat removed from the object is effected successively in time in portions from stage to stage with intermediate heat storage on heat accumulators. In order to effect this, the operation of each stage is carried out in active heat removal and thermal switch modes, wherein the duration of the time intervals and values of currents flowing through the stages of the thermobattery for those modes is adjusted in the process of bringing it to the steady-state mode of operation with required values of temperatures of the object being cooled and heat accumulators and with minimum value of electric power consumption. In accordance with the invention the number of thermopiles in all of the battery stages is taken to be identical, due to which substantial reduction of the consumption of scarce expensive semiconductor thermoelectric materials is attained, and this means a reduction in the specific costs of the thermoelectric battery.

1 Claim, 3 Drawing Sheets

METHOD OF COOLING AN OBJECT WITH A THERMOELECTRIC BATTERY CASCADE

FIELD OF THE INVENTION

The invention relates to the field of refrigeration engineering, in particular to small-size thermoelectric coolers and can be used in the creation of consumer, medical and special-purpose thermoelectric cooling devices.

PRIOR ART

A method of thermoelectric cooling is known based on the Peltier effect herewith where current is passed through a thermopile, one of its junctions is heated, the other cooled (see E. A. Kolenko "Thermoelectric cooling devices" USSR AS, 1987, pp. 7–11).

In order to obtain a sufficient degree of cooling, the actuating thermopiles are connected in series forming a thermoelectric battery. Realization of this method however causes a sharp reduction of the coefficient of performance of a refrigerating machine which is determined by the ratio of the removed heat flow to the consumed electric power, and the temperature drop between the hot and cold junctions of the thermobattery increases.

A method is also known for cooling an object, which method is based on the use of a thermoelectric battery (see USSR Inventor's Certificate No. 322821, IPC HO1L 35/30, F25B 21/02, 1971). This method consists of removing heat from the object from stage to stage when an adjustable regulated direct current is applied to the terminals of the battery until it reaches a steady-state operation mode.

The cold junctions of the first stage remove the heat flow from the object being cooled, which flows together with the electric power consumed by the that stage is passed to the cold junctions of the second stage. The heat flow removed from the object being cooled is applied to the cold junctions of the third stage in conjunction with the sum electric power consumed by the first and second stages of the battery, etc. Thus, each subsequent battery stage, electrically connected to the preceding thereto stage, should have a greater refrigerating capacity as compared with that preceding stage. Therefore, an increase in the refrigerating capacity of a battery stage is associated with a sharp increase in the amount of scarce semiconductor materials. The electric power consumed by a thermoelectric battery cascade is the sum of the electric power consumed by each of its stages.

Use of this method of cooling in view of its relatively low electric power consumption is advisable when it is necessary to obtain relatively small temperature drops (about 30° C.) between the hot and cold junctions of a thermoelectric battery.

An attempt to increase this temperature drop to more than 50° C. by increasing the number of stages results in a sharp increase in the electric power being consumed. Therefore, the use of thermoelectric batteries with the number of stages more than three is not considered to be practical, and in the majority of cases is difficult to realize from an engineering point of view.

DISCLOSURE OF THE INVENTION

The task of the present invention is to create such a method of cooling an object with a thermoelectric battery cascade which would sharply increase the coefficient of performance of a refrigerating machine and at the same time reduce the consumption of semiconductor thermoelectric materials.

This is achieved in the "Method of cooling an object with a thermoelectric battery cascade" by carrying heat from the object, herewith an adjustable regulated direct current is applied to the terminals of the battery until a steady-state operation mode is reached, the transfer of heat is effected separately from stage to stage with intermediate storing of heat in heat accumulators, the operation of each stage is conducted in nominal refrigerating capacity and thermal switch modes, while the duration of the time intervals of those modes and the current values through the stages are adjusted in the process of establishing the steady-state mode depending on the temperature of the object and of the heat accumulators.

BRIEF DESCRIPTION OF THE DRAWINGS

The invention is hereinafter illustrated by an example of its embodiments and appended drawings in which.

BEST EMBODIMENT OF CARRYING OUT THE INVENTION

Figure 1:
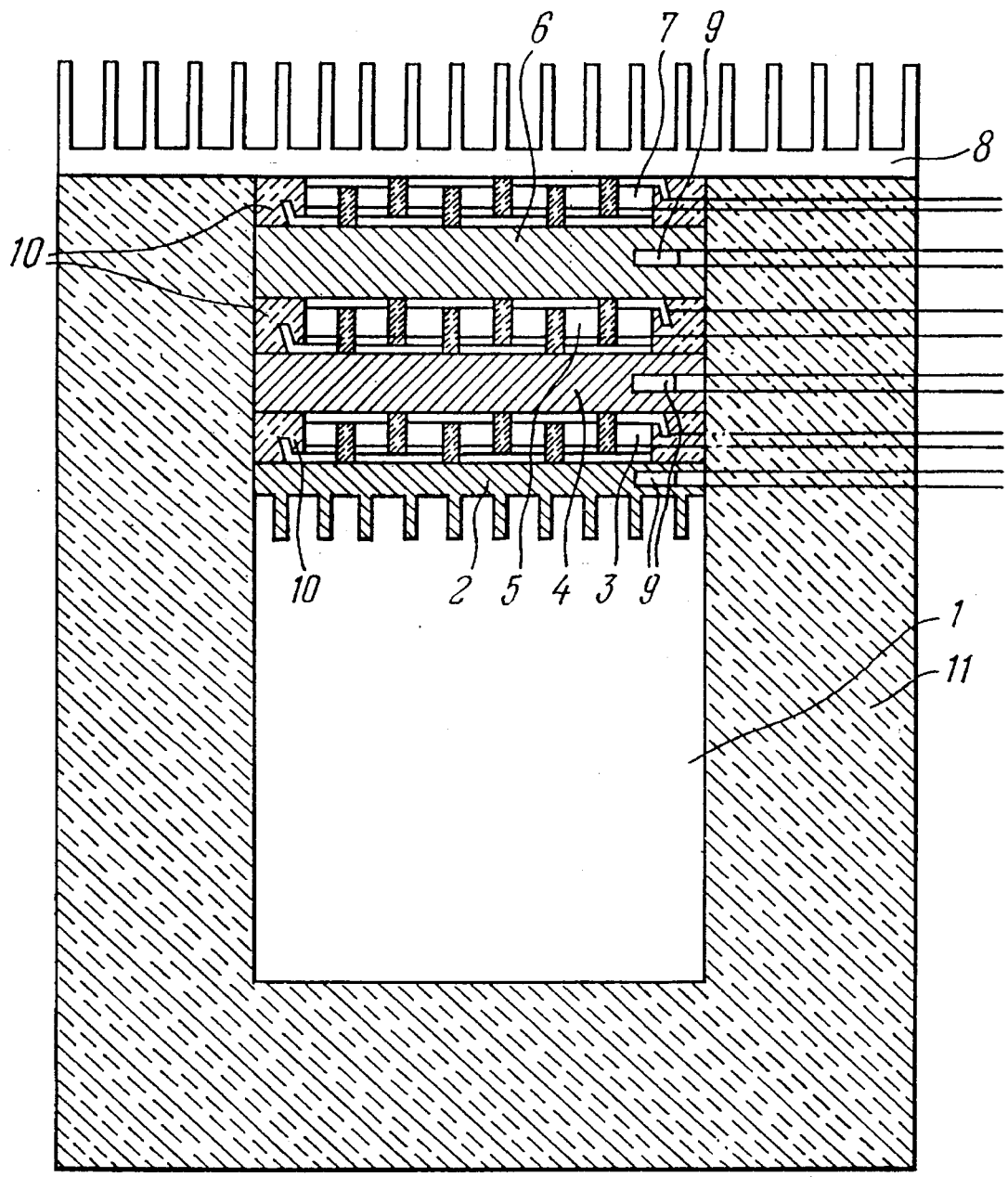
FIG. 1 shows a constructive diagram of the device for cooling an object in accordance with the proposed method of cooling.

In accordance with the proposed method of cooling, the transfer of heat in a multistage thermoelectric battery with intermediate heat accumulators and electrically independent stages is carried out in the following manner.

During operation of the first, coldest stage of the battery in the active heat removal mode during a time period $\Delta\tau_{1.1}$ (see FIG. 2) a certain amount of heat determined by the thermal properties of the heat accumulator and the refrigerating capacity of that stage, and also by the duration of the time interval $\Delta\tau_{1.1}$ is released into the heat accumulator of the following hereafter second stage of the battery. Evidence of this (see FIG. 2) is given by the increase of the temperature of the heat accumulator of the second stage in time, which heat accumulator is in the thermal switch mode during the time period $\Delta\tau_{1.1}$, which mode compensates the reverse overflow of heat through the thermopile and heat isolation of the second stage of the battery. At the moment the period of time $\Delta\tau_{1.1}$ ends the second stage goes into the mode of active removal of heat stored in its heat accumulator, while the first stage of the battery goes to the thermal switch mode. During subsequent operation of the first stage of the battery in that mode during the time interval $\Delta\tau_{1.2}$ the discharged heat accumulator of that stage is filled with thermal energy transmitted thereto by heat exchange from the object being cooled.

Transfer of heat to the second and subsequent stages of the battery is effected (see FIG. 2) in a similar manner during the whole process of cooling the object. In turn the average values and amplitudes of fluctuations of the temperature of the heat accumulators are reduced in the active heat removal and thermal switch modes until the battery is in the steady-state operation mode, which is characterized by the constant value of these parameters.

In order to obtain a steady-state mode for removal of heat from the object being cooled, corresponding to the required value of the temperature of the object being cooled with minimum power consumption, a corresponding selection is necessary of the duration of the time periods $\Delta\tau_{1.1}$ and $\Delta\tau_{1.2}$ of operation of the battery stages in the active heat removal and thermal switch modes and of the values of the currents $I_{o,i}$ and $I_{k,i}$ consumed in those modes. Wherein an increase of the current $I_{o,i}$ or of the duration of the time period $\Delta\tau_{1.1}$ for the ith stage of the battery results in a reduction of the steady-state average value of the temperature of the heat accumulators of that stage, but only with a corresponding increase in the duration of the time periods $\Delta\tau_{1.1}$ or currents $I_{o,i}$ consumed by subsequent stages of the battery in the active heat removal mode and a total duration $\Delta\tau_{1.1}+\Delta\tau_{1.2}$ of the cycles of their operation.

It should be noted that in the proposed method of cooling, with set values of currents $I_{o,i}$ and $I_{k,i}$ of each ith stage of the battery, it is possible, as distinctive from the known cooling method, to bring the battery to a steady-state mode of operation with optimum values of the refrigerating capacity and power consumption by selection of corresponding durations of time periods $\Delta\tau_{1.1}$ and $\Delta\tau_{1.2}$ for each ith stage of the battery. In combination with this factor, the possibility for independent control of the values of consumption currents $I_{o,i}$ and $I_{k,i}$ of the ith stage of the battery enables heat to be carried away from the object to be cooled with practically identical values of refrigerating capacity $Q_{o,i}$ of the stages of the battery in the active heat removal modes. This results in the use of an identical number of thermopiles in each stage of the battery, which ensures substantial reduction of the consumption of scarce semiconductor materials as compared with the known method of cooling an object with a thermoelectric battery cascade.

Figure 2:
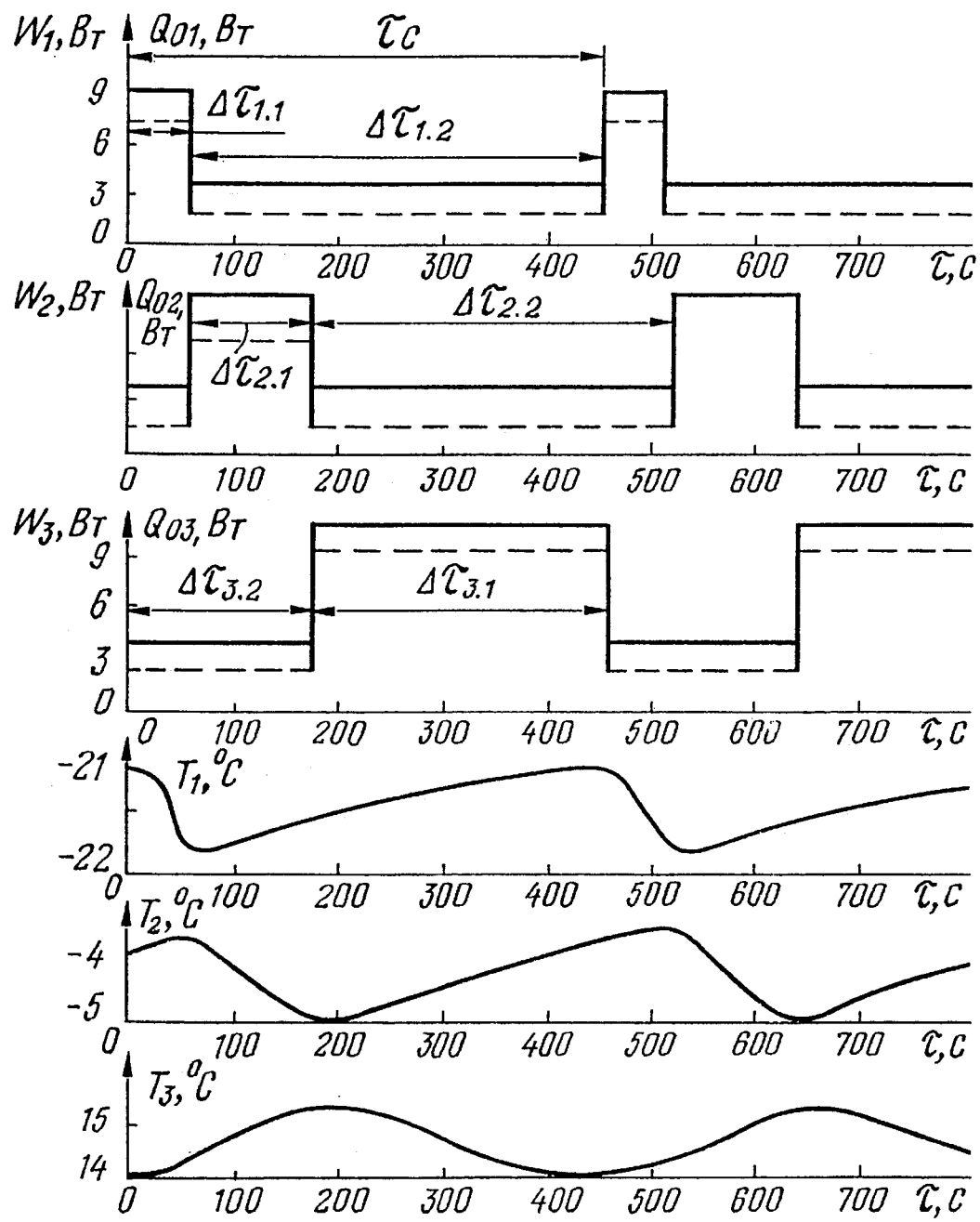
FIG. 2 shows a cyclogram of operation of a three-stage battery with intermediate heat accumulators in the steady-state mode of heat removal from the object being cooled. A characteristic change in time of the temperatures of the heat accumulators when the battery stages are operating in the active heat removal and thermal switch modes is also shown.

As is evident from the cyclogram shown in FIG. 2, the average value W of electric power, consumed in the steady-state mode of cooling the object, is determined by the equation $$W = \frac{\sum_{i \to 1} \int_0^{\tau_c} Wi(\tau)d-\tau}{\Delta\tau_c}$$

where $\Delta\tau_c = \Delta\tau_{1.1} + \Delta\tau_{1.2}$ is the duration of the cycle of operation of the first and each subsequent stage of the battery.

Wherein, at any moment of time, only one stage of the battery operates in the active heat removal mode with maximum power consumption. In view of this a substantial reduction of the power consumption is achieved when the proposed method of cooling is used, and this means that the coefficient of performance of a multistage battery is increased as compared with the known method of cooling based on its use.

In accordance with the constructive diagram of the device for realization of the proposed method of cooling shown in FIG. 1, an object 1 to be cooled is in heat exchange with a heat accumulator 2 of the first heat removing stage of the battery, which is made, for example, in the form of a heat-conducting plate with a ribbed heat-receiving surface. This heat accumulator is in thermal contact with the cold junctions of thermopiles 3 of the first stage of the battery. The hot junctions of the said thermopiles are in thermal contact with a heat accumulator 4 made, for example, in the form of a heat-conducting plate which is also in contact with the cold junctions of thermopiles 5 of that stage of the battery. The hot junctions of the thermopiles 5 are in thermal contact with a heat accumulator 6 of the third stage of the battery, also made, for example, in the form of a heat conducting plate. The heat accumulator 6 also has thermal contact with cold junctions of thermopiles 7 of the third stage of the battery, the hot junctions of which are in thermal contact with a heat conducting radiator 8, made, for example, in the form of a ribbed heat conducting plate. Each of the said heat accumulators has a temperature sensor 9, the gaps between the heat accumulators 2, 4 and 6 are filled in with thermal insulation 10. In turn the object 1 being cooled and the thermoelectric battery are encompassed by a thermal insulation 11.

Figure 3:
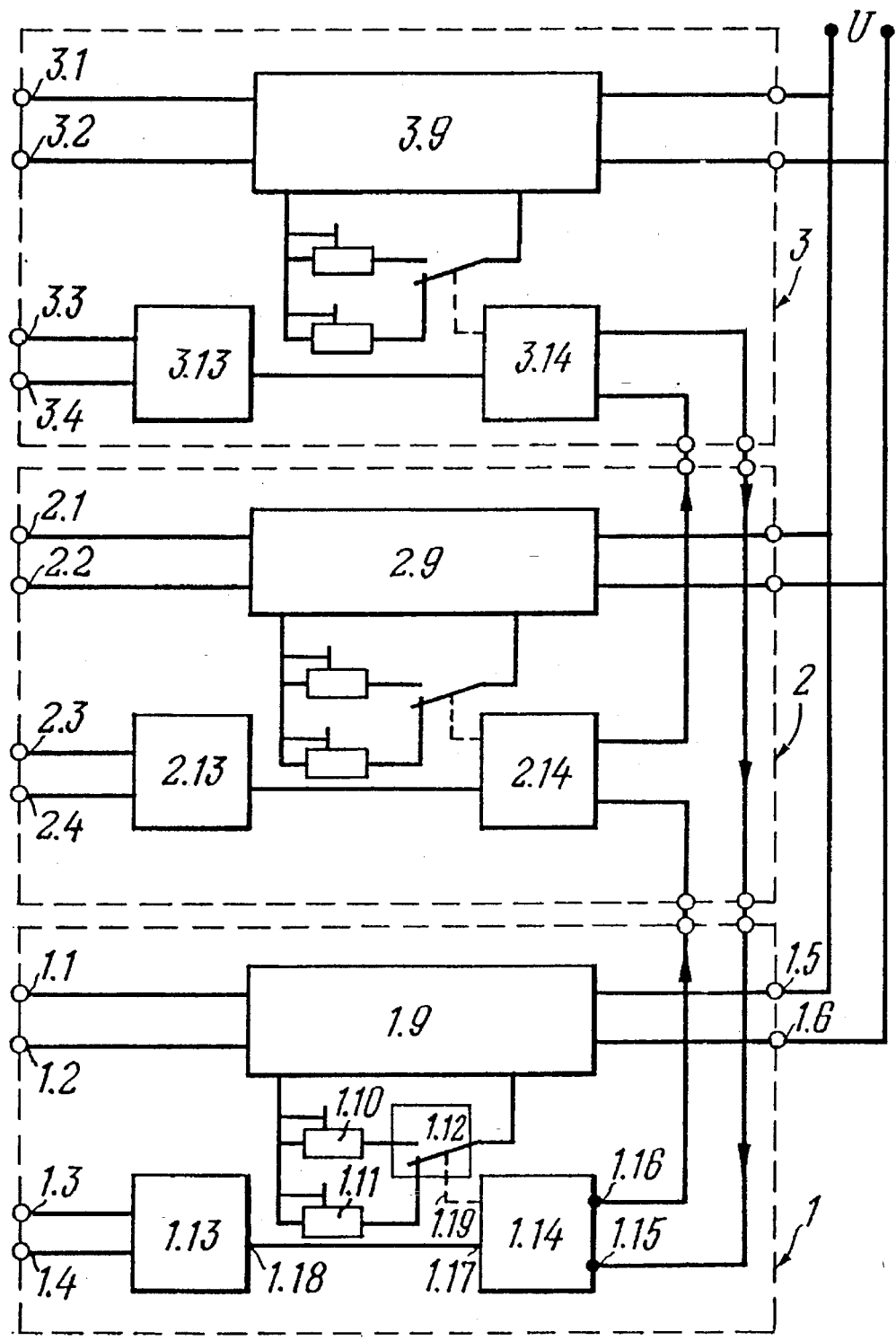
FIG. 3 shows an example of a functional diagram of the power supply and control of the process of cooling the object when the proposed method of cooling is carried out using the device shown in FIG. 1.

In conformity with the device being described, the functional diagram of the power supply of the battery stages and stages for control of its operation in accordance with the proposed method of cooling shown in FIG. 3 comprises three adjustable regulated DC sources for the first, second and third battery stages, respectively 1,2 and 3. Each ith regulated DC source has inputs i.5, i.6 for the power supply voltage U, outputs i.1, i.2, for the regulated DC for the ith stage of the thermoelectric battery, and information inputs i.3, i.4 for a sensor of the heat accumulator temperature of that stage of the battery. Each ith regulated DC source comprises a pulse regulator i.9, trimmers i.10, 1.11 for manual current adjustment, a two-position switch i.12, a comparator i.13 and a timer i.14. Inputs i.15 and outputs i.16 of the said timers of the regulated DC sources 1, 2 and 3 are connected to each other in a definite manner (see FIG. 3). An output 1.16 of a timer 1.14 is connected to an input 2.15 of a timer 2.14, an output 2.16 of the timer 2.14 is connected to an input 3.15 of a timer 3.14, while an output 3.16 of the timer 3.14 is connected to an input 1.15 of the timer 1.14, thus closing the loop. A control input i.17 of the timer i.14 of each ith regulated DC source is connected to an output i.18 of the comparator i.13, while a control output i.19 of the timer i.14 is connected to a control input of the two-position switch i.12 which is also as the trimmers i.10, i.11 connected to control inputs of the pulse current regulator i.9.

In accordance with the proposed method of cooling, the described circuit operates in the following manner after connection of the terminals of each ith stage of the battery and outputs of the temperature sensors of its heat accumulator respectively to the outputs i.1, i.2 and i.3, i.4 of the ith regulated DC source and supply of voltage U.

The timer 1.14 of the regulated DC source (see FIG. 3) of the first stage of the battery by means of a switch 1.12 transfers a regulator 1.9 into the state corresponding to operation of that stage in the active heat removal mode. Wherein, the power supply voltage U is converted by said regulator 1.9 into the regulated current flowing through the first stage of the battery. Using a trimmer 1.10 the value of current $I_{k,1}$ flowing through the thermopile of the first stage of the battery and corresponding to the mode of active heat removal by that stage is manually set. At the moment the power supply voltage U is supplied, the timers 2.14 and 3.14 by means of switches 2.12 and 3.12 connect trimmers 2.11 and 3.11, which are used to manually set the values of the currents flowing through the thermocouples of the second and third stages of the battery, to control inputs of regulators 2.9 and 3.9 respectively, which currents correspond to the thermal switch modes of those stages, $I_{k,2}$ and $I_{k,3}$ respectively.

At the moment of termination of the period of time $\Delta\tau_{2.1}$ after the power supply voltage U is supplied, this period being set by the timer 1.14, the switch 1.12 connects a trimmer 1.11 to control inputs of the regulator 1.9; as a result the first stage of the battery is switched to operation in the thermal switch mode, and a signal is formed at the output 1.16 of that timer, which signal is applied to the input 2.15 of the timer 2.14. This timer changes the state of the switch 2.12, which connects a trimmer 2.10 to the control inputs of the regulator 2.9, disconnecting the trimmer 2.11 therefrom. As a result the second stage of the battery is transferred from operation in the thermal switch mode to operation in the active heat removal mode. The value of current $I_{k.1}$ corresponding to operation of the first stage of the battery in the termal switch mode is set using the trimmer 1.11, while the value of the current $I_{a.2}$ flowing through the thermopiles of the second stage of the battery and corresponding to the mode of active removal of heat by that stage is set using the trimmer 2.10.

At the moment of termination of the next time interval $\Delta\tau_{2.1}$ set by the timer 2.14, this timer changes the state of the switch 2.12 which again connects the trimmer 2.11 to the control inputs of the regulator 2.9, disconnecting the trimmer 2.10 therefrom. Wherein, the second stage of the battery is again transferred to operation in the thermal switch mode, and a signal is formed at the output 2.16 of that timer 2.14, which signal is applied to the input 3.15 of the timer 3.14. This signal results in that the timer 3.14 changes the state of the switch 3.12 which switches a trimmer 3.10 to the control inputs of the regulator 3.9 disconnecting the trimmer 3.11 therefrom. As a result the third stage of the battery is transferred from the thermal switch mode to operation in the active heat removal mode. The trimmer 3.10 is used to set the value of current $I_{o.3}$ flowing through the trermopiles of the third stage of the battery to the value corresponding to the mode of active heat removal by that stage. At the moment of termination of the next time interval $\Delta\tau_{3.1}$ set by the timer 3.14, this timer changes the state of the switch 3.12 which again connects the trimmer 3.11 to the control inputs of the regulator 3.9, disconnecting the trimmer 3.10 therefrom. Wherein, the third stage of the battery is again transferred to operation in the thermal switch mode, and a signal is formed at the output 3.16 of the timer 3.14 which is applied to the input 1.15 of the timer 1.14. This signal results in that the first stage of the battery is again transferred from operation in the thermal switch mode to operation in the active heat removal mode. Further on the aforedescribed cycle of operation of the circuit for providing a current to the battery stages and for control of the battery operation is continuously repeated with steady-state values of consumption currents $I_{o.i}$ and $I_{k.i}$ of each ith stage and predetermined values of timing intervals $\Delta\tau_{i.1}$ set by the timers 1.14, 2.14, 3.14. The signal from the temperature sensor of the heat accumulator of each ith stage of the battery is continuously applied to the input of the comparator i.13 of the ith regulated DC source and it is compared with the predetermined value set in the comparator corresponding to the required minimum value $T_{i.min}$ of the temperature of the heat accumulator of the ith stage of the battery in the active heat removal mode. Wherein, if the condition $T_{i.2} \leq T_{i.min}$ is fulfilled, where $T_{i.2}$ is the actual value of the temperature of the heat accumulator, a signal appears at the output of the comparator i.13 which is transmitted to the input of the i.17 timer. As a result the timer i.14 transfers the switch i.12 to a state corresponding to operation of the ith stage of the battery in the thermal switch mode.

Thus automatic determination is effected of the optimum values of $\Delta\tau_{1.1}$, $\Delta\tau_{2.1}$ and $\Delta\tau_{3.1}$ of the time intervals of operation of the battery stages in the active heat removal mode corresponding to the established values of $I_{o.i}$ of the consumed currents in that mode, necessary to obtain a steady-state mode of the battery operation with minimum power consumption corresponding to those currents.

In order to carry out the method of cooling, heat conducting heat accumulators with temperature sensors on each of them are installed between the battery stages; the numbers of thermopiles in all the stages of the battery beginning with the second heat removal stage are made identical and equal to the number of thermopiles in the first heat removal stage, without infringing the successive connection of the thermopiles in each stage; the electrical connections between the battery stages are broken, the terminals of each ith battery stage are connected to a separate adjustable source of regulated DC; for each ith stage of the battery the values $\Delta\tau_{i.1}$ and $\Delta\tau_{i.2}$ of the time intervals corresponding respectively to the mode of active heat removal by thermopiles of that stage while the current $I_{o.i}$ is consumed thereby and to the thermal switch mode with current $I_{k.i}$ consumed by the thermopiles, on the basis of the conditions $\Delta\tau_{i+i1.1} > \Delta\tau_{i.2}$ and that for each ith stage beginning with the second heat removal stage of the battery the equation $\Delta\tau_{i.1} + \Delta_{i.2} = \Delta\tau_{1.1} + \Delta\tau_{1.2}$ is satisfied, the values $I_{o.i}$ and $I_{k.i} = (0.2-0.6)I_{o.i}$ of the consumption currents for each ith battery stage are set; the current $I_{o.1}$ is passed through the battery stage and currents $I_{k.i}$ are passed through all the subsequent battery stages; at the moment when the time period $\Delta\tau_{1.1}$ ends the current through the first stage of the battery is reduced to the value $I_{k.1}$, and the current through the second stage of the battery is increased to the value $I_{o.2}$; at the moment of termination of the subsequent time period $\Delta\tau_{2.1}$ the current $I_{o.2}$ through the second battery stage is again reduced to the value $I_{k.2}$, while the current through the third battery stage is increased to the value $I_{o.3}$; in a similar manner switching of operation modes of the battery stages is carried out successively in time and over the height of the battery up to the moment of time $\Delta\tau_{1.1} + \Delta\tau_{1.2}$; continuous repetition of these cycles of operation of the battery stages and constant control of the temperature of their heat accumulators is carried out, registered by temperature sensors of those heat accumulators; the steady-state mode for heat removal from the object being cooled is fixed by the constancy in time of the average values of temperatures of the heat accumulators of the battery stages and by the constancy in tume of the amplitudes of temperature changes when the battery stages operate in the active heat removal and thermal switch modes; by selecting the values of the duration of the time periods $\Delta\tau_{i.1}$ and $\Delta\tau_{i.2}$ of operation of the battery stages in the active heat removal and thermal switch modes and the currents consumed thereby $I_{o.i}$, $I_{k.i}$, the battery is transferred to the steady-state mode for removal of heat from the object being cooled, corresponding to the required value of the temperature of the object to be cooled and to the minimum value of power consumption.

INDUSTRIAL APPLICABILITY

Use of the method of cooling the object of a thermoelectric battery cascade makes it possible to:

bring the values of specific electric powers, consumed by domestic or special cooling devices to the values obtained with compression cooling devices by discretely removing head from stage to stage with intermediate heat accumulation on heat accumulators of stages of a thermoelectric battery and adjustment of current values and duration of active heat removal and thermal switch modes for each stage in the process of bringing the device to the required steady-state operation mode;

substantially expand the functional capabilities of cascade thermoelectric cooling in respect of the reached degree of cooling of the object due to ensuring the possibility for economical operation of the thermoelectric batteries with a number of stages more than three due to an increase of the refrigerating coefficient of individual stages and the thermoelectric battery as a whole;

substantially reduce the specific cost of a cooling device due to reduction of consumption of scarce and expensive semiconductor thermoelectric materials.

We claim:

1. Method of cooling an object with a thermoelectric battery cascade by carrying heat from the object and further from stage to stage with an adjustable regulated direct current applied to the terminals of the battery until a steady-state operation mode is obtained corresponding to the required temperature of the object being cooled, characterized in that transfer of heat is conducted successively in time in portions from stage to stage with intermediate heat storage on heat accumulators, wherein operation of each stage is conducted in active heat removal and thermal switch modes, while the duration of the time intervals and values of currents flowing through the stages of the thermobattery for these modes is adjusted during the process of bringing it to the steady-state mode of operation with required values of temperatures of the object being cooled and of the heat accumulators and with minimum value of electric power consumption.

* * * * *

UNITED STATES PATENT AND TRADEMARK OFFICE
CERTIFICATE OF CORRECTION

PATENT NO. : 5,605,048
DATED : February 25, 1997
INVENTOR(S) : Jury Kozlov, et. al.

It is certified that error appears in the above-indentified patent and that said Letters Patent is hereby corrected as shown below:

Title page, item [73], Assignee: should be-- Libratsia--.

item [22], "3" should be -- 30--.

Signed and Sealed this

Third Day of June, 1997

*Attest:*

BRUCE LEHMAN

*Attesting Officer*    Commissioner of Patents and Trademarks

UNITED STATES PATENT AND TRADEMARK OFFICE
CERTIFICATE OF CORRECTION

PATENT NO.   : 5,605,048
DATED        : February 25, 1997
INVENTOR(S)  : Jury Kozlov, et. al.

It is certified that error appears in the above-identified patent and that said Letters Patent is hereby corrected as shown below:

Title page, item [73], Assignee: should read -- "Libratsia" -- instead of Libratsia.

item [22], "3" should be -- 30--.

This certificate supersedes Certificate of Correction issued June 3, 1997.

Signed and Sealed this

Thirty-first Day of March, 1998

Attest:

BRUCE LEHMAN

Attesting Officer

Commissioner of Patents and Trademarks